United States Patent [19]

Mitty et al.

[11] Patent Number: 5,734,554
[45] Date of Patent: Mar. 31, 1998

[54] HEAT SINK AND FAN FOR COOLING CPU CHIP

[75] Inventors: Nagaraj P. Mitty, San Jose; Herbert E. LeCornu, Newark; Deviprasad Malladi, Campbell, all of Calif.

[73] Assignee: Sun Microsystems, Inc., Mountain View, Calif.

[21] Appl. No.: 671,310

[22] Filed: Jul. 1, 1996

[51] Int. Cl.$^6$ ........................................ H05K 7/20
[52] U.S. Cl. ...................... 361/697; 165/80.3; 257/719; 361/704; 361/710
[58] Field of Search ................... 165/80.2, 80.3, 165/185; 174/16.3; 257/706, 707, 712, 713, 718, 719, 726, 727; 361/695–697, 704, 707, 709–710, 715, 717, 718, 722

[56] References Cited

U.S. PATENT DOCUMENTS

| | | | |
|---|---|---|---|
| 3,801,882 | 4/1974 | Ward | 317/234 R |
| 4,724,514 | 2/1988 | Kaufman | 361/710 |
| 4,879,891 | 11/1989 | Hinshaw | 72/254 |
| 4,884,331 | 12/1989 | Hinshaw | 29/558 |
| 5,307,236 | 4/1994 | Rio et al. | 361/720 |
| 5,603,374 | 2/1997 | Wu | 361/704 |
| 5,621,615 | 4/1997 | Dawson | 361/715 |

*Primary Examiner*—Gregory D. Thompson
*Attorney, Agent, or Firm*—Julian Caplan; Flehr Hohbach Test Albritton & Herbert LLP

[57] ABSTRACT

Because of space limitations, a small heat sink and a fan (of about 2"×2"×½" size) is used to cool to below 105° C. (at an ambient temperature of about 40° C.) a CPU chip (of about 16 mm×16 mm size) which uses about 30 watts current and is mounted on a motherboard of considerably larger size. A heat transferring thermostrate washer covers the chip and a pad covers the washer. Soldered to the pad is a square heat slug. Studs extend upward from the slug. The studs fit through holes in the base of the heat sink. The heat sink is of the type having plural rectangular cross-section fins extending upwardly from the base. Above the heat sink is a fan attached to the motherboard by screws at its four corners extending through heat slug and into the motherboard.

9 Claims, 3 Drawing Sheets

HEAT SINK AND FAN FOR COOLING CPU CHIP

CROSS REFERENCE TO RELATED APPLICATIONS

Reference is made to co-pending application, Ser. No. 08/661,517 filed Jun. 11, 1996, entitled COOLING SYSTEM FOR ENCLOSED ELECTRONIC COMPONENTS.

BACKGROUND OF THE INVENTION

1. Field of the Invention

This invention relates to a new and improved heat sink used in cooling CPU chips. More particularly, the invention relates to a heat sink for cooling a chip which consumes considerable power (such as 30 watts), but occupies a very small area, such as a space of about 16 mm×16 mm.

2. Related Art

Heat sinks mounted above electronic chips are well known in the art but heretofore no heat sink of such small dimensions has been capable of cooling chips which generate so much heat and yet maintain the junction temperature at 105° C. or less. Methods of manufacture of heat sinks are disclosed in U.S. Pat. No. 4,879,891 and U.S. Pat. No. 4,884,331.

SUMMARY OF THE INVENTION

The heat sink of the present invention is preferably formed of anodized aluminum and has a base from which pins extend vertically upwardly in a pattern of rows and columns. Preferably, the heat sink is fabricated from extruded aluminum wherein rows of pins or fins extend upward from the base. These fins have a thickness at their base in a first direction of approximately 0.065 inch and taper upwardly so that they are thinner at the top than at the base. The spacing between fins at the base is approximately 0.095 inch. The fins are then divided into columns of pins by transverse cuts in a second direction perpendicular to the first direction. Accordingly, the width of each pin at its base is approximately 0.065 inch, and the spacing between pins in each row is approximately 0.065 inch. The thickness of the base of the heat sink is approximately 0.200 inch and the height of each pin above the base is approximately 0.450 inch.

In the preferred embodiment of the present invention, the base has a dimension of 2.146 inch by 2.015 inch. There is in each row 14 pins and in each column 16 pins. Fabrication of the heat sink in this manner is very economical as contrasted with other production methods.

The heat sink is mounted above a chip which consumes approximately 30 watts of power in an ambient temperature of about 40° C. and maintains the temperature at the junction of the heat sink and the chip below 105° C. by reason of the very efficient heat transfer and dissipation of heat.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENT

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
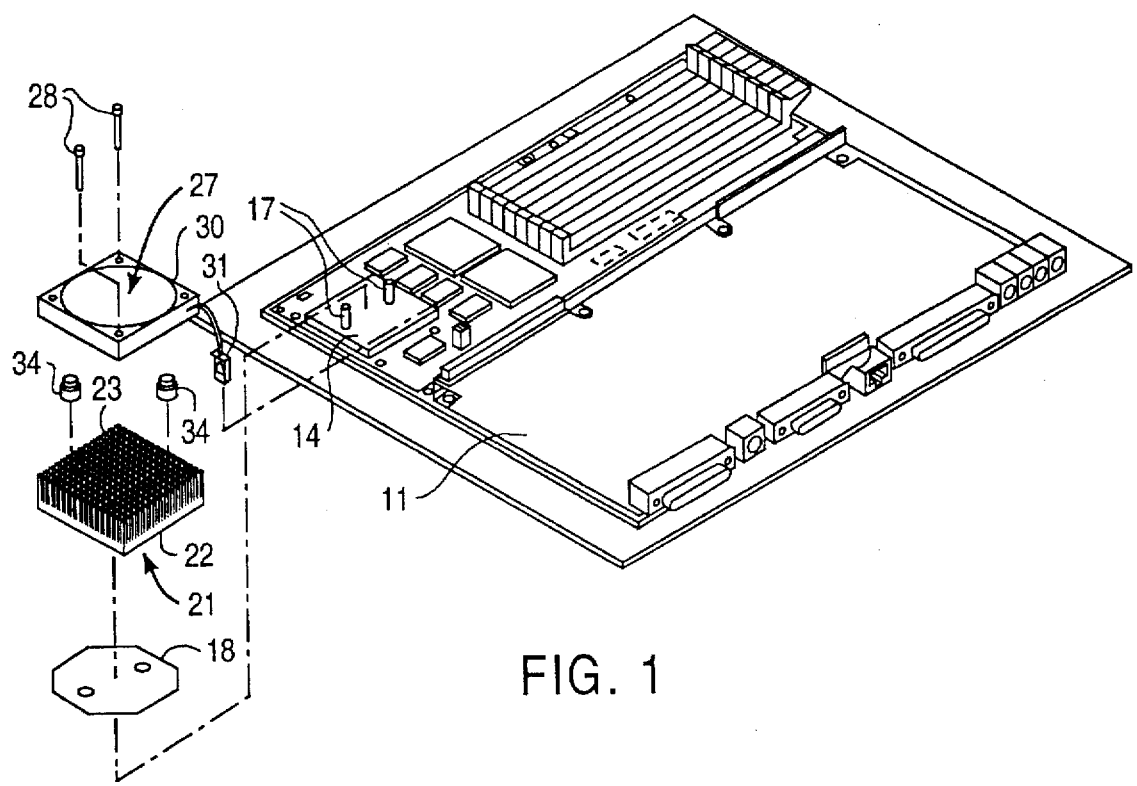
FIG. 1 is a schematic exploded perspective view of components of the present invention.
Figure 2:
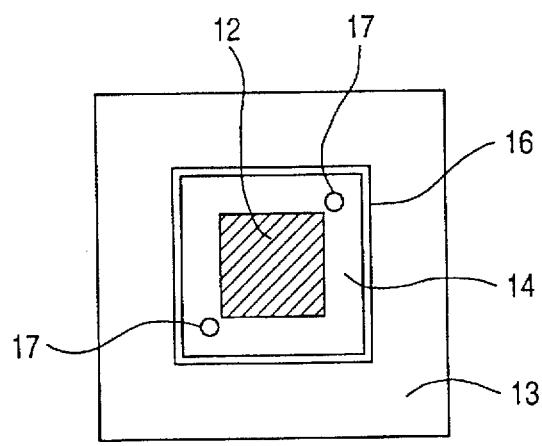
FIG. 2 is an enlarged top plan view of a portion of the structure of FIG. 1.
Figure 3:
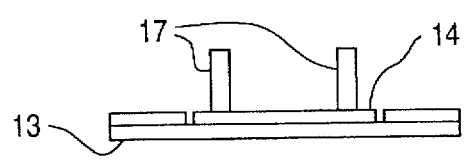
FIG. 3 is a side elevational view of the structure of FIG. 2.
Figure 4:
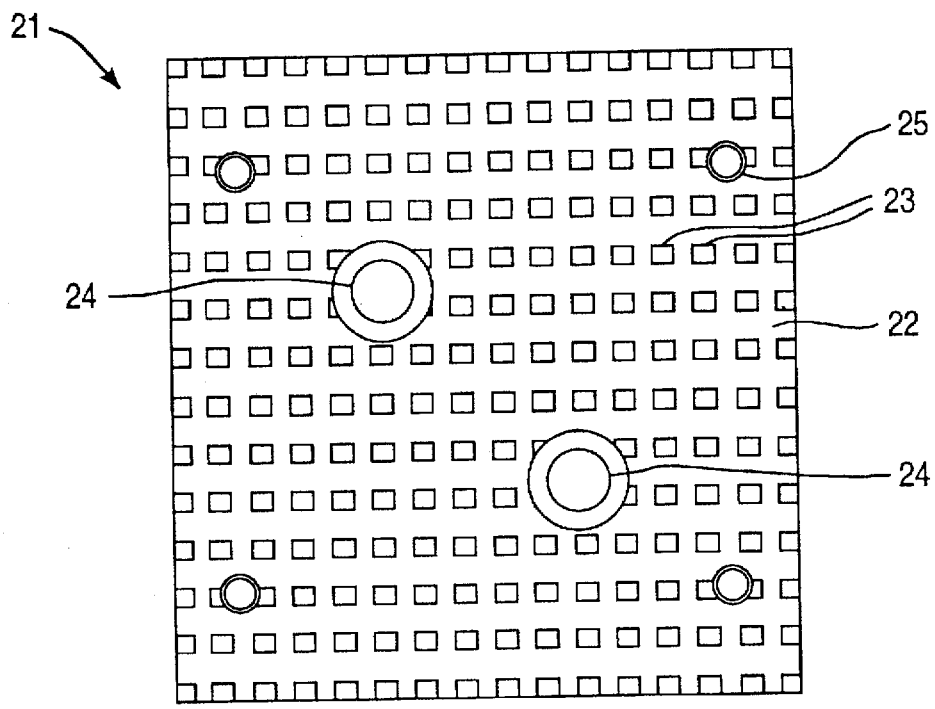
FIG. 4 is a top plan view of the heat sink.
Figure 5:
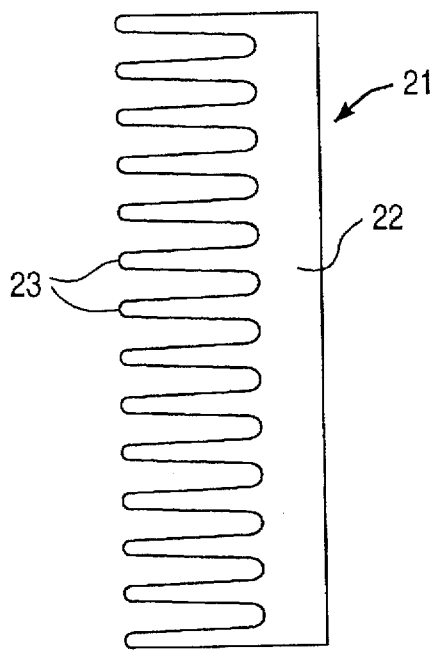
FIG. 5 is a side elevational view as viewed from the right in FIG. 4.
Figure 6:
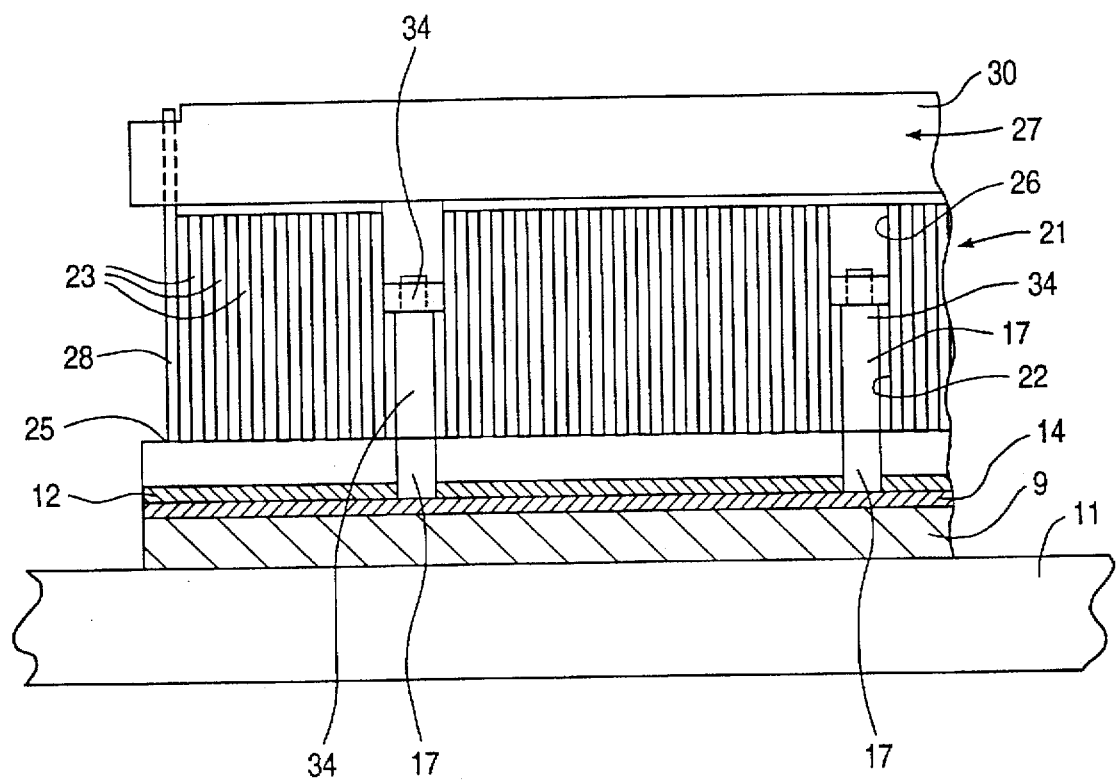
FIG. 6 is a schematic (not to scale) vertical sectional view through the assembly of fan, heat sink pad, washer and motherboard.

The present invention is used in conjunction with a fairly large motherboard 11 mounted in an enclosure for electronic equipment. Positioned on the motherboard 11 is a CPU chip 9 having a pad 11 fixed to its upper surface. Such a chip consumes approximately 30 watts and has a footprint of approximately 16 mm×16 mm. Heat slug 14 of approximately square shape is attached to pad 13 by solder around the peripheral edges of the slug 14. Extending upward from slug 14 are studs 17 which are threaded at least at their upper ends. As shown in FIG. 2, studs 17 are located adjacent opposite corners of slug 14. Thermostrate thin washer 12 of high heat conductivity is positioned above the slug 14.

Heat sink 21, imposed above washer 12, is formed of extruded aluminum, which is anodized after fabrication is otherwise completed. In order to expedite and economize in fabrication, the heat sink is extruded, each row of pins 23 initially comprising a continuous fin. Fourteen fins extend upward from base 22 which is approximately 0.200 inch thick and each fin has a height above base 22 of approximately 0.425 inch. The spacing between fins is approximately 0.095 inch at base 22 and each fin is approximately 0.065 inch minimum in width at its base and tapers upwardly.

Columns of pins 23 are cut from the fins by means of transverse cuts, the width of each cut being 0.065 inch and the resultant thickness of each pin being 0.065 inch. There are 16 columns of pins. Studs 17 extend through holes 24 in heat sink 21 and nuts 34 cause tight contact between the bottom of base 22 and washer 12 and also washer 12 and slug 14.

Mounted above the upper ends of pins 23 is a fan 27 having a casing 30 held onto base 22 by screws 28 which fit through holes 25. Fan 27 is approximately 50×50 mm and 10 mm in height. A thermistor 31 controlling the voltage applied to fan 27 is plugged into a socket (not shown) on the motherboard 11 as well understood in this art.

Before holes 24 and 25 are drilled and counterbored there is an array or regular pattern of pins 23 consisting of 14 pins 23 in a row in a first direction and 16 pins 23 in a column in a second direction perpendicular to the first direction. Although both the fan 27 and heat sink 21 are small in size, by reason of the structure heretofore described, it is possible to maintain the temperature of the CPU below 105° C. when the ambient temperature is around 40° despite the fact that chip 9 consumes 30 watts.

Definitions—Explanations

As used in the accompanying claims:

"Row" means a plurality of pins arrayed in a first direction parallel to the fins. Each row is a preferably extruded as a fin along with the base and then divided into pins by cuts in a second direction perpendicular to the first direction.

"Column" means a plurality of pins projecting above the base arranged in said second direction.

"Width" with respect to a pin is the distance between edges of a pin in said second direction.

"Thickness" with respect to a pin is the distance between edges of a pin at the base in said first direction.

"Column spacing" with respect to a pin is the distance between edges of adjacent pins at the base in said first direction.

"Row spacing" with respect to a pin is the distance between edges of adjacent pins in said second direction.

In the above Specification we have set out that the heat sink base is approximately 2.015×2.146 and that there are 16 columns of pins in a first direction and 14 fins or rows of pins in a second direction at right angles to the first direction. If the length or width of the base were varied (i.e., made longer or shorter) to accommodate a chip of a different shape, the number of pins in either direction would be increased or decreased in number, but the dimensions of the pins and spacing between pins would remain substantially the same.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. In combination, a chip, a heat slug above and in contact with said chip, said slug having studs extending upwardly therefrom, a thermostrate washer above said slug, a heat sink above said washer, said heat sink having a base in contact with said washer and an array of plurality of upward extending pins, said washer and said base being formed with holes for passage of said studs, nuts bearing on said base and threaded on said studs for drawing said base, said washer and said slug tightly together, a fan having a casing in close contact with distal ends of said pins and means securing said casing to said base.

2. The combination of claim 1 in which said chip consumes 30 watts of power.

3. The combination of claim 1 in which said hole is formed in said array of pins for each said stud.

4. The combination of claim 1 in which said means securing said casing comprises screws engaging said casing and threaded into said base, said array of pins being formed with holes for passage of said screws.

5. The combination of claim 1 in which said chip is approximately 16 mm×16 mm, said base being approximately 2.015 inch by 2.146 inch.

6. The combination of claim 5 in which said pins are disposed in an array of 14 pins per row and 16 pins per column.

7. The combination of claim 6 in which each said pin is 0.065 inch by 0.065 inch at its base.

8. The combination of claim 7 in which said pins taper distally, the thickness of each pin at its distal end being substantially the same as at its base and the width of each pin at its distal end being substantially less than at its base.

9. The combination of claim 8 in which column spacing is approximately 0.095 inch and pin spacing is approximately 0.065 inch at the proximal ends of said pins.

* * * * *